United States Patent
Belotserkovsky et al.

(10) Patent No.: US 8,184,523 B2
(45) Date of Patent: May 22, 2012

(54) METHOD AND SYSTEM FOR COMPENSATION OF A CARRIER FREQUENCY OFFSET IN AN OFDM RECEIVER

(75) Inventors: Maxim Borisovich Belotserkovsky, Indianapolis, IN (US); Vincent Demoulin, Pleumeleuc (FR); Louis Robert Litwin, Jr., Plainsboro, NJ (US)

(73) Assignee: Thompson Licensing, Boulogne (FR)

( * ) Notice: Subject to any disclaimer, the term of this patent is extended or adjusted under 35 U.S.C. 154(b) by 1272 days.

(21) Appl. No.: 10/481,061

(22) PCT Filed: Jun. 22, 2001

(86) PCT No.: PCT/US01/20054
§ 371 (c)(1),
(2), (4) Date: Dec. 16, 2003

(87) PCT Pub. No.: WO03/001760
PCT Pub. Date: Jan. 3, 2003

(65) Prior Publication Data
US 2004/0156349 A1    Aug. 12, 2004

(51) Int. Cl.
*H04L 5/12*    (2006.01)
*H04L 27/00*    (2006.01)
*H04J 11/00*    (2006.01)

(52) U.S. Cl. .......................... 370/208; 370/215; 375/316

(58) Field of Classification Search .................. 370/203, 370/215
See application file for complete search history.

(56) References Cited

U.S. PATENT DOCUMENTS

| | | | |
|---|---|---|---|
| 4,575,682 A | 3/1986 | Aoyagi et al. | 329/50 |
| 5,228,062 A | 7/1993 | Bingham | 375/97 |
| 5,732,113 A | 3/1998 | Schmidl et al. | 375/355 |

(Continued)

FOREIGN PATENT DOCUMENTS

EP        895388        2/1999

(Continued)

OTHER PUBLICATIONS

IEEE Globecom 1996 "Communications: The Key to Global Prosperity" Conference Record Vo. 2 of 3, London, Nov. 18-22, 1996, pp. 1442-1446.

(Continued)

*Primary Examiner* — Chirag Shah
*Assistant Examiner* — Suk Jin Kang
(74) *Attorney, Agent, or Firm* — Robert D. Shedd; Vincent E. Duffy; Michael A. Pugel

(57) ABSTRACT

An Orthogonal Frequency Division Multiplexing (OFDM) receiver that employs N second-order phase-lock loops sharing a common integrator (where N is the number of pilots in the system). The N second order phase-lock loops track out independent pilot phase rotations to facilitate the constructive averaging of the pilots' phase information. At the same time, by sharing a common integrator, the OFDM receiver takes advantage of noise averaging over multiple pilots to obtain a cleaner frequency offset estimation. The OFDM receiver may also compensate for FFT window drift by calculating a phase difference between a selected pair of pilots and tracking the rate of change of the calculated phase difference over time. The calculated phase difference is used to control the position of an upstream FFT window after a predetermined phase difference threshold is exceeded. The tracked rate of change is used to continuously adjust the phase of downstream equalizer taps.

18 Claims, 6 Drawing Sheets

U.S. PATENT DOCUMENTS

| | | | | |
|---|---|---|---|---|
| 5,812,523 | A * | 9/1998 | Isaksson et al. | 370/208 |
| 5,920,598 | A | 7/1999 | Hyakudai et al. | 375/316 |
| 6,219,333 | B1 * | 4/2001 | Ahn | 370/203 |
| 6,240,146 | B1 * | 5/2001 | Stott et al. | 375/344 |
| 6,266,361 | B1 * | 7/2001 | Huang et al. | 375/140 |
| 6,320,627 | B1 * | 11/2001 | Scott et al. | 348/726 |
| 6,560,294 | B1 * | 5/2003 | Gatherer | 375/261 |
| 6,618,352 | B1 * | 9/2003 | Shirakata et al. | 370/203 |
| 6,647,025 | B1 * | 11/2003 | Sudo | 370/503 |
| 6,839,388 | B2 * | 1/2005 | Vaidyanathan | 375/326 |
| 6,853,616 | B1 * | 2/2005 | Kim et al. | 370/210 |
| 6,985,432 | B1 * | 1/2006 | Hadad | 370/203 |
| 7,058,002 | B1 * | 6/2006 | Kumagai et al. | 370/203 |
| 7,203,261 | B2 * | 4/2007 | Gupta | 375/376 |
| 7,324,432 | B1 * | 1/2008 | Kim | 370/208 |
| 2002/0017948 | A1 * | 2/2002 | Hyakudai et al. | 329/304 |
| 2002/0065047 | A1 * | 5/2002 | Moose | 455/63 |
| 2002/0150168 | A1 * | 10/2002 | Crawford | 375/260 |
| 2002/0159533 | A1 * | 10/2002 | Crawford | 375/260 |
| 2002/0176483 | A1 * | 11/2002 | Crawford | 375/137 |

FOREIGN PATENT DOCUMENTS

| | | |
|---|---|---|
| JP | 60-052147 | 3/1986 |
| JP | H 04-227348 | 4/1993 |
| JP | 2001-69119 | 3/2001 |
| WO | 99/27671 | 6/1999 |

OTHER PUBLICATIONS

Search report dated Apr. 5, 2002.

Patrick Robertson/Stefan Kaiser of German Aerospace Research Establisment (DLR), Institute for Communications Technology, Titled: Analysis of the Effects of Phase-Noise in Orthogonal Frequency Division Multiplex (OFDM) Systems, IEEE Magazine, Feb. 1995, pp. 1652-1657.

* cited by examiner

US 8,184,523 B2

METHOD AND SYSTEM FOR COMPENSATION OF A CARRIER FREQUENCY OFFSET IN AN OFDM RECEIVER

This application claims the benefit, under 35 U.S.C. §365 of International Application PCT/US01/20054, filed Jun. 22, 2001, which was published in accordance with PCT Article 21(2) on Jan. 3, 2003 in English.

BACKGROUND OF THE INVENTION

The present invention relates to processing orthogonal frequency division multiplexed (OFDM) signals.

A wireless LAN (WLAN) is a flexible data communications system implemented as an extension to, or as an alternative for, a wired LAN within a building or campus. Using electromagnetic waves, WLANs transmit and receive data over the air, minimizing the need for wired connections. Thus, WLANs combine data connectivity with user mobility, and, through simplified configuration, enable movable LANs. Some industries that have benefited from the productivity gains of using portable terminals (e.g., notebook computers) to transmit and receive real-time information are the digital home networking, health care, retail, manufacturing, and warehousing industries.

Manufacturers of WLANs have a range of transmission technologies to choose from when designing a WLAN. Some exemplary technologies are multicarrier systems, spread spectrum systems, narrowband systems, and infrared systems. Although each system has its own benefits and detriments, one particular type of multicarrier transmission system, orthogonal frequency division multiplexing (OFDM), has proven to be exceptionally useful for WLAN communications.

OFDM is a robust technique for efficiently transmitting data over a channel. The technique uses a plurality of sub-carrier frequencies (sub-carriers) within a channel bandwidth to transmit data. These sub-carriers are arranged for optimal bandwidth efficiency compared to conventional frequency division multiplexing (FDM) which can waste portions of the channel bandwidth in order to separate and isolate the sub-carrier frequency spectra and thereby avoid inter-carrier interference (ICI). By contrast, although the frequency spectra of OFDM sub-carriers overlap significantly within the OFDM channel bandwidth, OFDM nonetheless allows resolution and recovery of the information that has been modulated onto each sub-carrier.

The transmission of data through a channel via OFDM signals also provides several other advantages over more conventional transmission techniques. Some of these advantages are a tolerance to multipath delay spread and frequency selective fading, efficient spectrum usage, simplified sub-channel equalization, and good interference properties.

Although OFDM exhibits these advantages, conventional implementations of OFDM also exhibit several difficulties and practical limitations. One difficulty is the issue of determining and correcting for carrier frequency offset, a major aspect of OFDM synchronization. Ideally, the receive carrier frequency, $f_{cr}$, should exactly match the transmit carrier frequency, $f_{ct}$. If this condition is not met, however, the mismatch contributes to a non-zero carrier frequency offset, delta $f_c$, in the received OFDM signal. OFDM signals are very susceptible to such carrier frequency offset which causes a loss of orthogonality between the OFDM sub-carriers and results in inter-carrier interference (ICI) and a severe increase in the bit error rate (BER) of the recovered data at the receiver.

Many OFDM standards require the transmission of pilots (known values) embedded in the user data. In conventional OFDM systems, it is common to average the pilots' phase information to improve closed-loop carrier frequency offset tracking in a noisy environment. For example, the average of the pilots' phases may be used to derive a carrier frequency offset estimation which, in turn, may be used to adjust the phase rotations of an equalizer's taps such that the effects of the carrier frequency offset are reduced or removed. One drawback to this technique is that, in the presence of a time-varying channel, the phases of the pilots may vary independently. More specifically, all the pilots' phases share a common phase rotation representative of the carrier frequency offset caused by the mis-match between the transmitter carrier frequency and the receiver carrier frequency, as discussed above. However, in the presence of a time varying channel, each pilot phase may also contain an independent phase rotation caused by the transmission channel varying with time. These independent pilot phase rotations can potentially result in a destructive averaging of the pilots' phases which, in turn, may corrupt the derivation of a carrier frequency offset estimation. A corrupted carrier frequency offset estimation may degrade the performance of any processing unit (e.g., an equalizer) that uses the estimation to compensate for the actual carrier frequency offset. The present invention is directed to the correction of this problem.

It is also possible that the frequency of the sampling clock of the receiver will differ slightly from the frequency of the sampling clock of the transmitter. If there is a frequency difference, the FFT window positioning with respect to the received signal can gradually drift over time. The time domain drift will result in a phase rotation of the received OFDM subcarriers in the frequency domain. The phase rotation may generate errors in the user data recovered by the OFDM receiver. The present invention is also directed to the correction of this problem.

BRIEF SUMMARY OF THE INVENTION

An Orthogonal Frequency Division Multiplexing (OFDM) receiver that employs N second-order phase-lock loops sharing a common integrator (where N is the number of pilots in the system). The N second order phase-lock loops track out independent pilot phase rotations to facilitate the constructive averaging of the pilots' phase information. At the same time, by sharing a common integrator, the OFDM receiver takes advantage of noise averaging over multiple pilots to obtain a cleaner frequency offset estimation. The OFDM receiver may also compensate for FFT window drift by calculating a phase difference between a selected pair of pilots and tracking the rate of change of the calculated phase difference over time. The calculated phase difference is used to control the position of an upstream FFT window after a predetermined phase difference threshold is exceeded. The tracked rate of change is used to continuously adjust the phase of downstream equalizer taps.

DETAILED DESCRIPTION OF THE INVENTION

The characteristics and advantages of the present invention will become more apparent from the following description, given by way of example.

Figure 1:
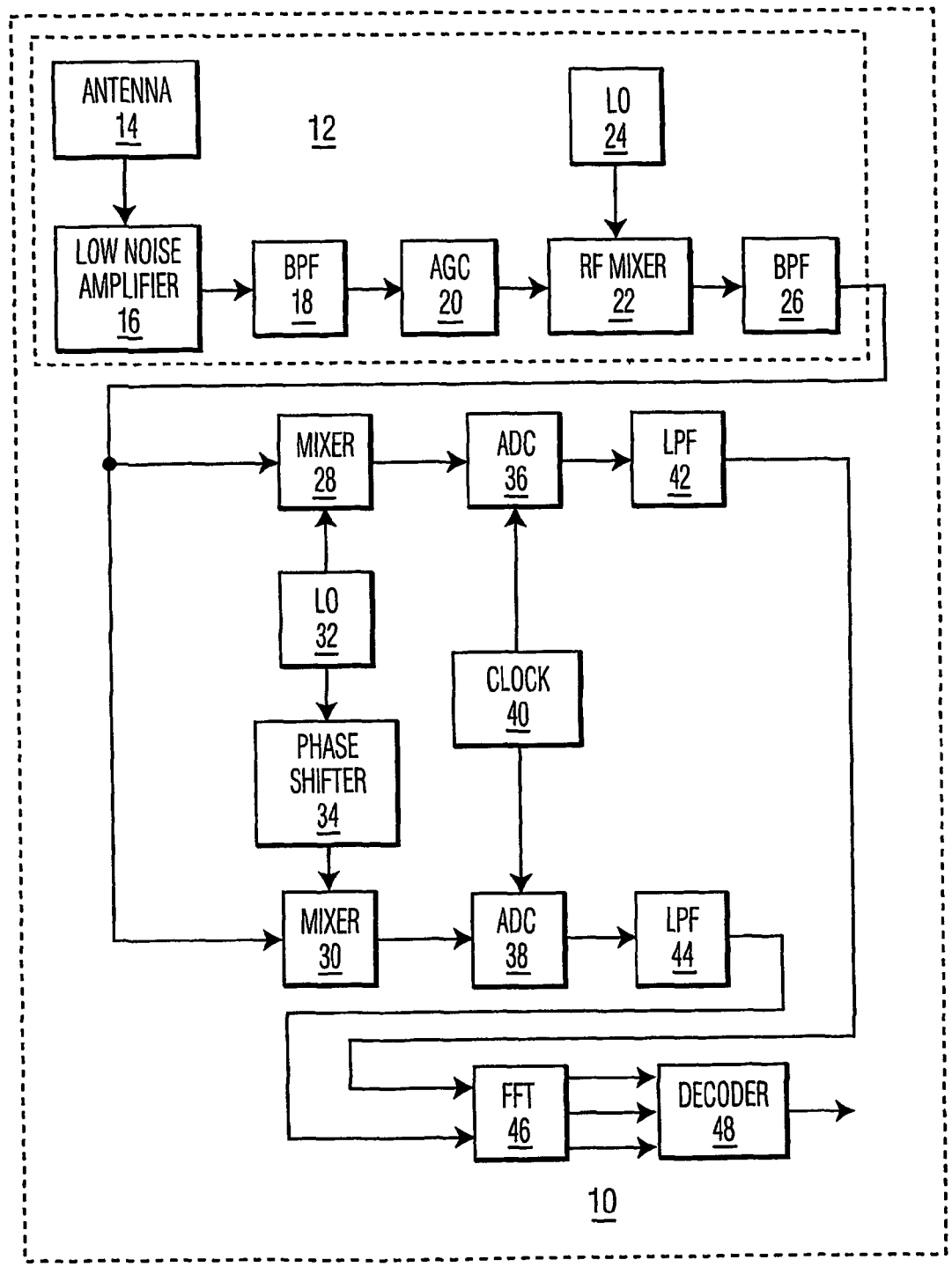
FIG. 1 is a block diagram of an exemplary OFDM receiver.

Referring to FIG. 1, the first element of a typical OFDM receiver 10 is an RF receiver 12. Many variations of RF receiver 12 exist and are well known in the art, but typically, RF receiver 12 includes an antenna 14, a low noise amplifier (LNA) 16, an RF bandpass filter 18, an automatic gain control (AGC) circuit 20, an RF mixer 22, an RF carrier frequency local oscillator 24, and an IF bandpass filter 26.

Through antenna 14, RF receiver 12 couples in the RF OFDM-modulated carrier after it passes through the channel. Then, by mixing it with a receiver carrier of frequency fcr generated by RF local oscillator 24, RF receiver 12 downconverts the RF OFDM-modulated carrier to obtain a received IF OFDM signal. The frequency difference between the receiver carrier and the transmitter carrier contributes to the carrier frequency offset, delta $f_c$.

This received IF OFDM signal is coupled to mixer 28 and mixer 30 to be mixed with an in-phase IF signal and a 90° phase-shifted (quadrature) IF signal, respectively, to produce in-phase and quadrature OFDM signals, respectively.

The in-phase IF signal that feeds into mixer 28 is produced by an IF local oscillator 32. The 90° phase-shifted IF signal that feeds into mixer 30 is derived from the in-phase IF signal of IF local oscillator 32 by passing the in-phase IF signal through a 90° phase shifter 34 before providing it to mixer 30.

The in-phase and quadrature OFDM signals then pass into analog-to-digital converters (ADCs) 36 and 38, respectively, where they are digitized at a sampling rate $f_{ck\_r}$ as determined by a clock circuit 40. ADCs 36 and 38 produce digital samples that form an in-phase and a quadrature discrete-time OFDM signal, respectively. The difference between the sampling rates of the receiver and that of the transmitter is the sampling rate offset, delta $f_{ck} = f_{ck\_r} - f_{ck\_t}$.

The unfiltered in-phase and quadrature discrete-time OFDM signals from ADCs 36 and 38 then pass through digital low-pass filters 42 and 44, respectively. The output of lowpass digital filters 42 and 44 are filtered in-phase and quadrature samples, respectively, of the received OFDM signal. In this way, the received OFDM signal is converted into in-phase (qi) and quadrature (pi) samples that represent the real and imaginary-valued components, respectively, of the complex-valued OFDM signal, $r_i = q_i + jp_i$. These in-phase and quadrature (real-valued and imaginary-valued) samples of the received OFDM signal are then delivered to FFT 46. Note that in some conventional implementations of receiver 10, the analog-to-digital conversion is done before the IF mixing process. In such an implementation, the mixing process involves the use of digital mixers and a digital frequency synthesizer. Also note that in many conventional implementations of receiver 10, the digital-to-analog conversion is performed after the filtering.

FFT 46 performs the Fast Fourier Transform (FFT) of the received OFDM signal in order to recover the sequences of frequency-domain sub-symbols that were used to modulate the sub-carriers during each OFDM symbol interval. FFT 46 then delivers these sequences of sub-symbols to a decoder 48.

Decoder 48 recovers the transmitted data bits from the sequences of frequency-domain sub-symbols that are delivered to it from FFT 46. This recovery is performed by decoding the frequency-domain sub-symbols to obtain a stream of data bits which should ideally match the stream of data bits that were fed into the OFOM transmitter. This decoding process can include soft Viterbi decoding and/or Reed-Solomon decoding, for example, to recover the data from the block and/or convolutionally encoded sub-symbols.

Figure 2:
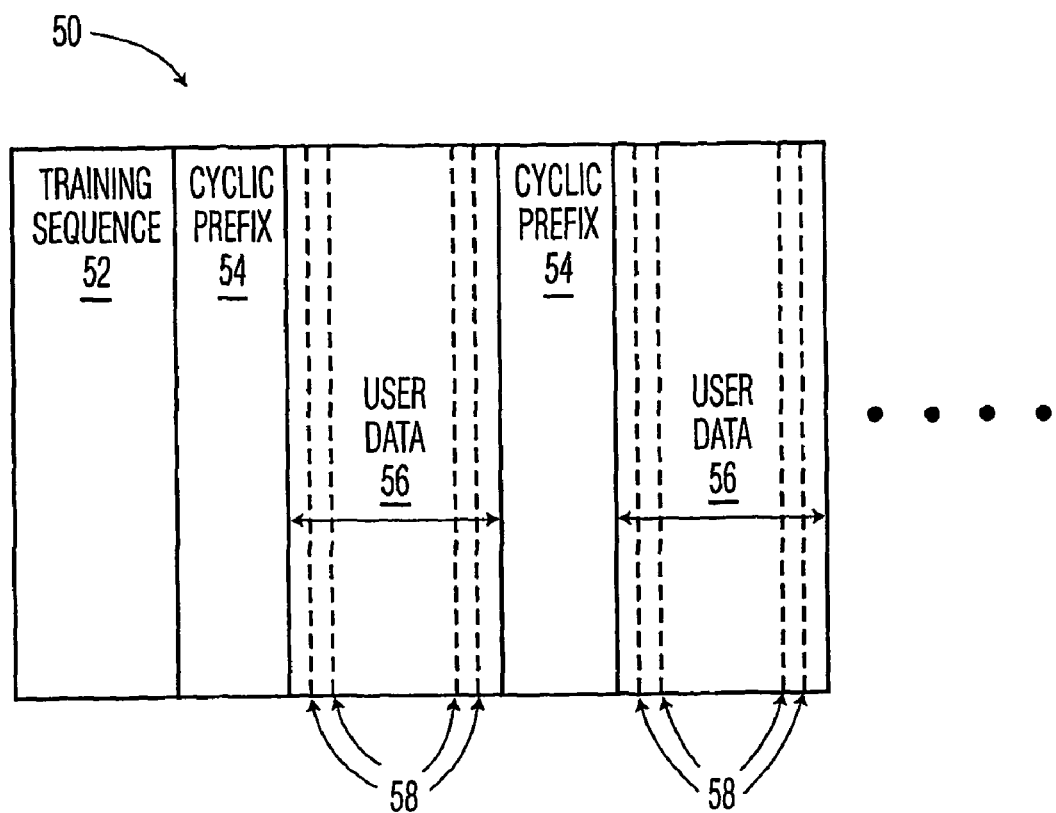
FIG. 2 is a diagram illustrating the placement of a training sequence, user data, and pilot signals within an OFDM symbol frame according to the present invention.

Turning to FIG. 2, an exemplary OFDM symbol frame 50 of the present invention is shown. Symbol frame 50 includes a training sequence or symbol 52 containing known transmission values for each subcarrier in the OFDM carrier, and a predetermined number of cyclic prefix 54 and user data 56 pairs. For example, the proposed ETSI-BRAN HIPERLAN/2 (Europe) and IEEE 802.11a (USA) wireless LAN standards, herein incorporated by reference, assign 64 known values or subsymbols (i.e., 52 non-zero values and 12 zero values) to selected training symbols of a training sequence (e.g., "training symbol C" of the proposed ETSI standard and "long OFDM training symbol" of the proposed IEEE standard). User data 56 has a predetermined number of pilots 58, also containing known transmission values, embedded on predetermined subcarriers. For example, the proposed ETSI and IEEE standards have four pilots located at bins or subcarriers ±7 and ±21. Although the present invention is described as operating in a receiver that conforms to the proposed ETSI-BRAN HIPERLAN/2 (Europe) and IEEE 802.11a (USA) wireless LAN standards, it is considered within the skill of one skilled in the art to implement the teachings of the present invention in other OFDM systems.

Figure 3:
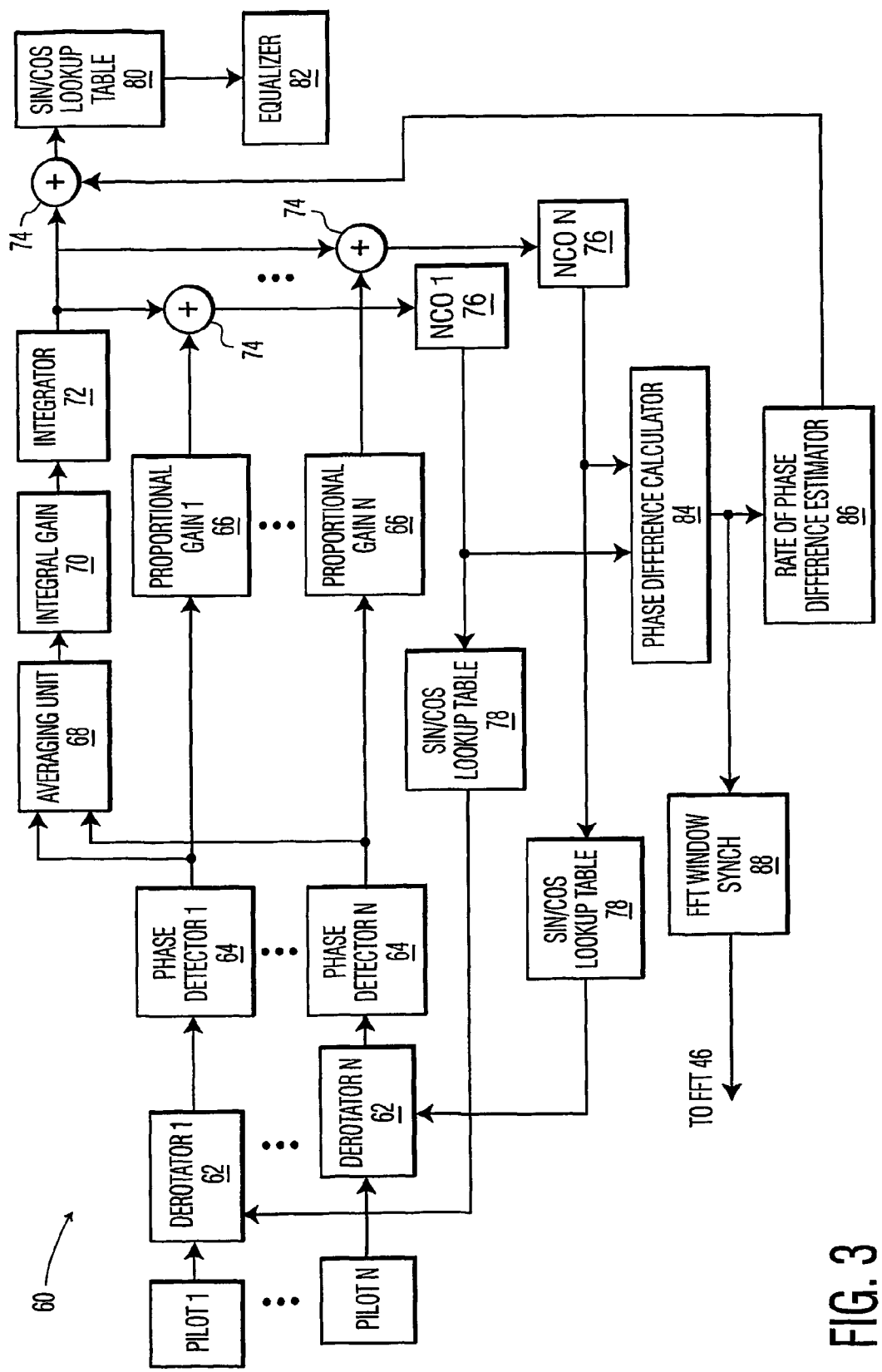
FIG. 3 is a block diagram illustrating a carrier frequency offset compensation system for an OFDM receiver according to the present invention.
Figure 4:
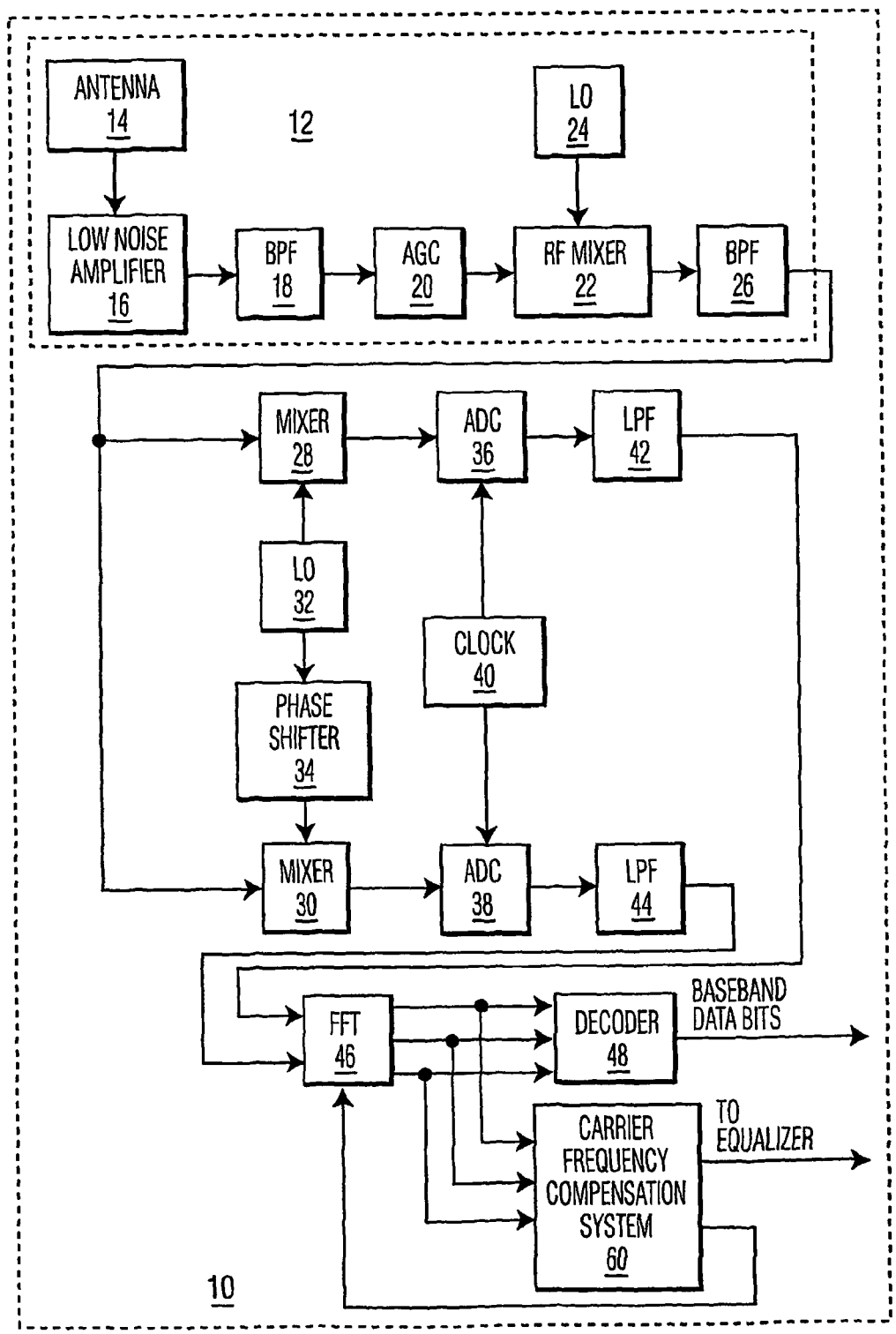
FIG. 4 is a block diagram illustrating the present invention as integrated with the exemplary OFDM receiver of FIG. 1.

Referring now to FIG. 3, an exemplary embodiment of the present invention is shown. Although the present invention is illustrated as being distinct from the elements of OFDM receiver of FIG. 1, one skilled in the art will readily devise that the present invention may be integrated with the elements of the OFDM receiver, as shown in FIG. 4 and discussed below. However, the present invention is illustrated as a distinct carrier frequency offset compensation system for clarity, ease of reference, and to facilitate an understanding of the present invention.

Referring now to FIG. 3, a carrier frequency offset compensation system 60 is shown. It should be noted that system 60 may be embodied in software, hardware, or some combination thereof. System 60 includes a plurality of second-order phase-lock loops that share a common integrator. As discussed below in further detail, the plurality of phase-lock loops enable the removal of independent pilot phase errors (i.e., phase rotations) caused by a time varying channel and, thereby, facilitates the constructive averaging of the pilots' phase information for deriving a carrier frequency offset estimate. It should be further noted that by sharing a common integrator, noise averaging is advantageously taken over multiple pilots to derive a cleaner carrier frequency offset estimate.

More specifically, there are N second-order phase-lock loops (PLLs) where N represents the number of pilots processed by system 60. Each second-order PLL includes a derotator or complex multiplier 62, a phase error detector 64, a proportional gain stage 66, a summer 74, a numerically controlled oscillator (NCO) 76, and a Sin/Cos look-up table 78. The second-order PLLs also share an averaging unit 68, an integral gain stage 70 and an integrator 72 that are coupled between phase detector 64 and summer 74 of each PLL. A Sin/Cos table 80 may be coupled to the output of integrator 72 and to an input of an equalizer 82. Furthermore, a phase difference calculator 84, comparator 86 and FFT window offset corrector 88 arrangement may be coupled to the output of the NCOs 76 of the second order PLLs, as discussed in further detail below.

In operation, each pilot 58 of a user data segment 56 is processed by a separate PLL and is averaged with the other pilots 58 of a user data segment 56. More specifically, each derotator 62 multiplies a received pilot with a complex number (representing an independent phase error correction) to drive the independent phase error towards zero.

Each derotator 62 passes the processed pilot to a phase error detector 64. Each phase error detector 64 derives a phase error of the pilot. One exemplary way to derive phase error is by calculating the difference between a known ideal phase of the pilot and the actual phase of the received pilot. The use of other phase error derivation techniques, as known by those skilled in the art, is considered within the scope of the present invention. In each PLL, the phase error is passed to an associated proportional gain stage 66 as well as to the shared averaging unit 68. Each proportional gain stage 66 scales the received phase error (representing the independent phase rotation of the pilot) to a predetermined increment usable by the associated NCO 76 of each PLL. Averaging unit 68 averages the phase error values received for all the pilots in a given user data segment and passes the average error (representing the average phase rotation for all of the pilots in a given user segment) to integral gain stage 70. Integral gain stage 70 scales the average phase error to a predetermined increment usable by each NCO 76 as well as by Sin/Cos lookup table 80, as discussed in further detail below. Integrator 72 integrates the scaled average phase errors received from integral gain stage 70 and outputs an integrated scaled phase error representing the common phase error for all the pilots over multiple user data segments. It should be noted a portion of the integrated scaled phase error will be due to the independent phase rotations of the pilots until a certain lock condition is reached, as discussed below.

Figure 5:
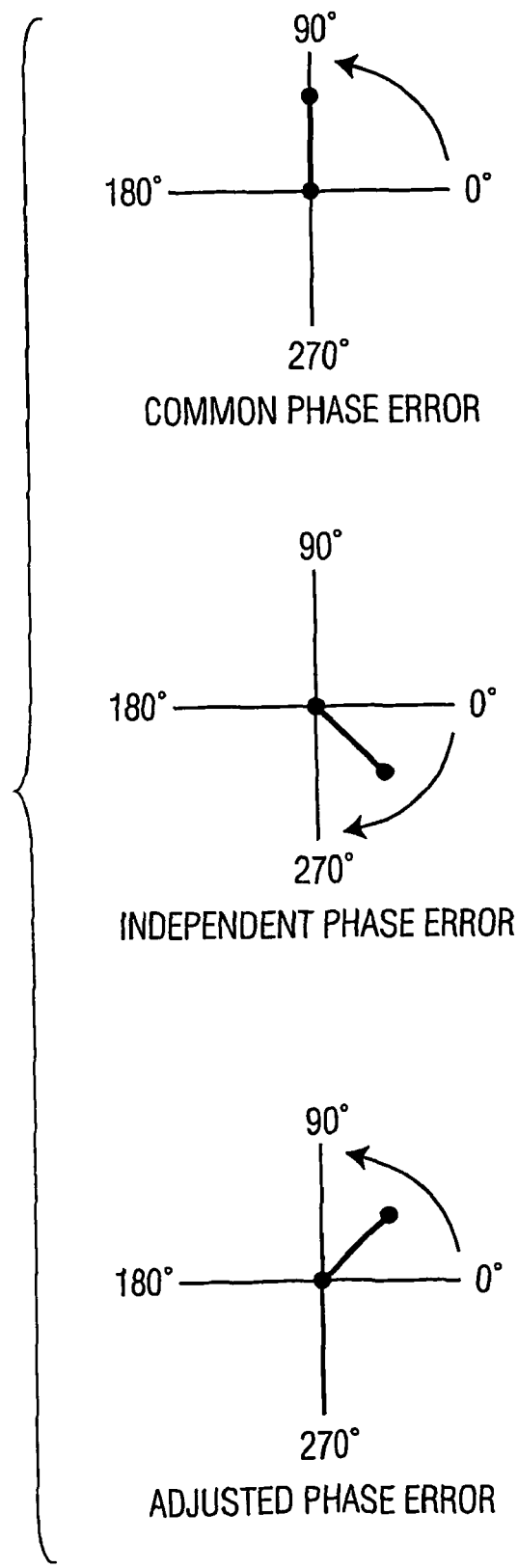
FIGS. 5 and 6 are graphical representations of common, independent, and adjusted phase errors.
Figure 6:
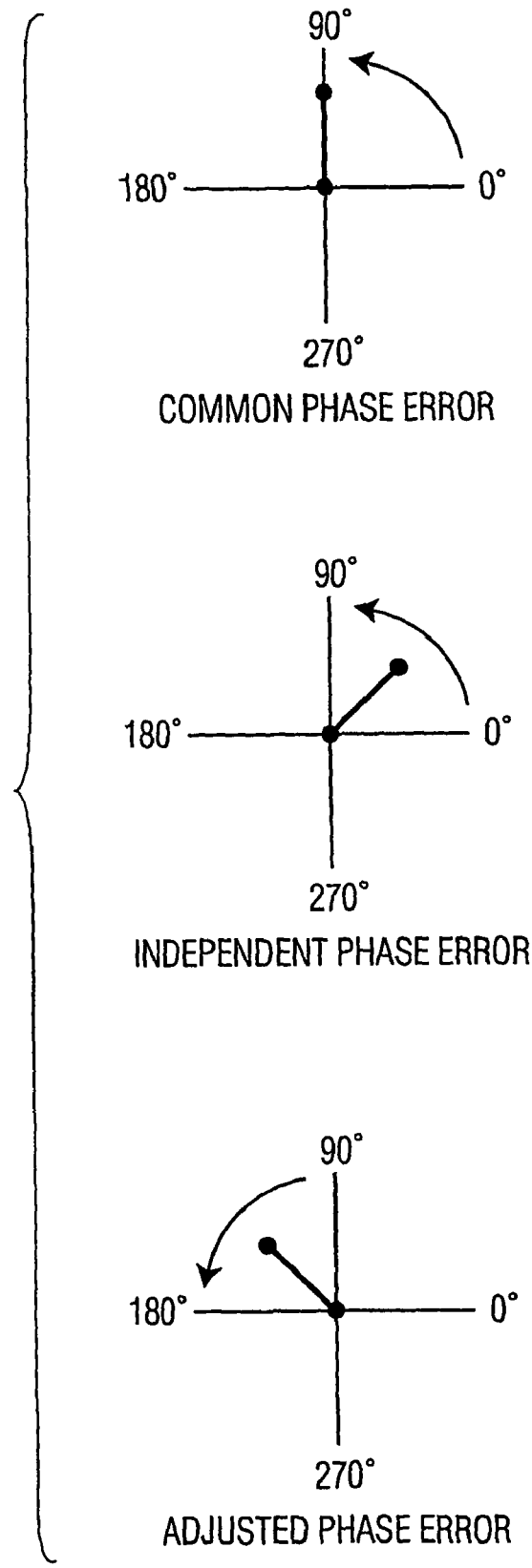

The summer 74 of each PLL sums the independent phase error received from the associated proportional gain stage 66 and the common phase error received from integrator 72. The resulting value represents the common phase rotation for all the pilots as adjusted by the independent pilot phase rotation caused by the time varying channel. Referring now to FIGS. 5 and 6, graphical illustrations of common phase errors, independent phase errors, and adjusted phase errors are shown for two PLLs.

The adjusted phase error output from each summer 74 is passed to an associated NCO 76 that accumulates received phase errors over time. Each lookup table 78 of a given PLL converts the output of an associated NCO 76 into a phasor. The phasor is passed back to the associated derotator 62 which multiplies the next received pilot with the phasor to rotate the pilot such that the independent phase error is driven towards zero.

In addition to the second-order phase-lock loops, a Sin/Cos table 80 is coupled to integrator 72 for converting, after a predetermined lock condition, the output of integrator 72 into a carrier frequency-offset estimate used by equalizer 82 to adjust the phase rotation of the equalizer taps. It should be noted that the carrier frequency-offset estimate may be passed to other processing units (not shown) for correction of the carrier frequency offset. One exemplary lock condition is when the output of integrator 72 falls within a predetermined range over a predetermined period of time. Such an occurrence indicates that the PLLs have reached steady state and the independent phase errors have been removed. It should be noted that a single time-shared PLL may preferably be used instead of the plurality of PLLs shown in FIG. 3 to process the pilots and remove the independent phase errors from the pilots.

As discussed above, the frequency of the sampling clock of the receiver may differ slightly from the frequency of the sampling clock of the transmitter. If there is a frequency difference, the FFT window positioning with respect to the received signal can gradually drift over time. The FFT window drift will result in a phase rotation of the received OFDM subcarriers. The phase rotation may generate errors in the user data recovered by the OFDM receiver. The phase difference calculator 84, rate of phase difference estimator 86 and FFT window synch unit 88 arrangement is directed to compensation and correction of the FFT window offset.

More specifically, phase difference calculator 84 calculates the difference between the values output from a given pair of NCOs 76. This difference is equal to the phase difference between a given pair of pilot subcarriers in a user data segment. It should be noted that the NCO values will roll over after reaching ±pi. Therefore, phase difference calculator 84 tracks the number of times the value of each NCO 76 exceeds ±pi to accurately calculate the phase difference between the values output from a given pair of NCOs 76. The calculated phase difference is passed to rate of phase difference estimator 86 and FFT window synch unit 88. FFT window synch unit 88 compares the calculated phase difference to a threshold phase difference (e.g., a phase difference representative of an FFT window offset of one sample) and controls the position of an upstream FFT window (e.g., shifts the window by a sample) if the calculated phase difference exceeds the threshold phase difference. In this manner, the FFT window offset of an upstream FFT may be periodically corrected when the calculated phase difference exceeds a predetermined threshold phase difference. Estimator 86 tracks the rate of change of the calculated phase difference over multiple user data segments. Estimator 86 generates an equalizer adjustment value that can be combined (e.g., via summer 74) with the output of integrator 72 such that the carrier-frequency offset output from Sin/Cos table 80 is compensated for the continuously changing phase difference between the values output from a given pair of NCOs 76. In this manner, the equalizer taps of a downstream equalizer can be continuously rotated to compensate for a gradually drifting FFT window.

Referring now to FIG. 4, the present invention is integrated with the exemplary OFDM receiver of FIG. 1, as shown. More specifically, system 60 is coupled to the outputs of FFT 46 and to the inputs of a processing unit that compensates for a carrier frequency error (e.g., equalizer 82 of FIG. 3 and/or a front end frequency offset correction unit (not shown)). Furthermore, an output of system 60 is fed back to FFT 46. With this arrangement, system 60 extracts pilots from the OFDM samples received from FFT 46 and derives a frequency offset estimate free of the independent phase errors caused by a time varying channel. System 60 also processes the extracted pilots to compensate (e.g., in equalizer 82) and correct (e.g., in FFT 46) for FFT window drift.

The invention claimed is:

1. A method for processing an Orthogonal Frequency Division Multiplexing (OFDM) signal in an OFDM receiver, the method comprising the steps of:

receiving the OFDM signal;

extracting a first plurality of pilots from a first user data segment of the received OFDM signal;

calculating an independent phase error for each pilot of the first plurality of pilots and a first common phase error based upon an average of said independent phase errors for each pilot of said first plurality of pilots;

extracting a second plurality of pilots from a second user data segment of the received OFDM signal, each pilot of said second plurality of pilots associated with one pilot from said first plurality of pilots;

separately derotating each pilot of said second plurality of extracted pilots to reduce the independent phase error of each pilot of said second plurality of pilots using the calculated first common phase error and the calculated independent phase error for the associated pilot from said first plurality of pilots;

calculating a phase error for each separately derotated pilot of said second plurality of pilots and a second common phase error based in part upon an average of said phase errors for each separately derotated pilot of said second plurality of extracted pilots;

integrating the second common phase error to reduce the effects of noise; and deriving a carrier frequency offset estimate from the integrated second common phase error.

2. The method of claim 1, further comprising the step of: correcting for a carrier frequency offset using the carrier frequency offset estimate.

3. The method of claim 1, wherein the step of derotating includes passing each pilot of the first plurality of pilots through a distinct phase-lock loop.

4. The method of claim 1, wherein the step of derotating includes passing each pilot of the plurality of pilots through a time-shared phase-lock loop.

5. The method of claim 1, wherein said deriving a carrier frequency offset estimate is performed after the phase errors of each pilot of the second plurality of pilots has been reduced below a predetermined value.

6. The method of claim 5, wherein the predetermined value is selected such that the derived carrier frequency offset estimate is substantially constant.

7. The method of claim 1, further comprising the steps of:
calculating a phase difference between a predetermined pair of extracted pilots;
comparing the calculated phase difference to a threshold value, the threshold value representative of a predetermined FFT window offset; and
adjusting an FFT window of an upstream FFT module if the calculated phase difference exceeds the threshold value.

8. The method of claim 7, wherein the step of deriving a carrier frequency offset estimate further includes the steps of:
tracking the rate of change of the calculated phase difference; and
adjusting the derived carrier frequency offset estimate to compensate for the tracked rate of change, the tracked rate of change being representative of a phase rotation due to an FFT window offset.

9. The method of claim 1, wherein the OFDM receiver is implemented in one of a wireless LAN adapter, a home networking terminal, a portable terminal, and a desktop terminal.

10. A system for processing an Orthogonal Frequency Division Multiplexing (OFDM) signal, the system comprising:
a processing module for receiving a first, second, and third plurality of pilots from an OFDM signal and for reducing an independent phase error of each pilot of said second and third plurality of pilots through derotation based upon an independent phase error determined in part from a corresponding pilot of a prior plurality of pilots; and a carrier frequency offset estimator module coupled to the processing module, the carrier frequency offset estimator module deriving a carrier frequency offset estimate from the third plurality of pilots after the independent phase error of each pilot of the third plurality of pilots is reduced below a predetermined value, the carrier frequency offset estimator module including:

an averaging unit for calculating a first common phase error for the first plurality of pilots used by the processing module to reduce the independent phase error of each pilot and for calculating a second common phase error for the plurality of pilots after the independent phase error of each pilot of the third plurality of pilots is reduced below a predetermined value, the second common phase error representative of an average pilot phase rotation caused by a carrier frequency offset, and an integrator unit for integrating the first common phase error and the second common phase error to reduce the effects of noise.

11. The system of claim 10, wherein the OFDM receiver is implemented in one of a wireless LAN adapter, a home networking terminal, a portable terminal, and a desktop terminal.

12. The system of claim 10, wherein the predetermined value is substantially zero.

13. The system of claim 10, wherein the predetermined value is selected such that the derived carrier frequency offset estimate is substantially constant.

14. The system of claim 10, wherein the processing module includes a plurality of phase-lock loops, each phase-lock loop being dedicated for a predetermined pilot within a user data segment.

15. The system of claim 10, wherein the processing module includes a time-shared phase-lock loop clocked for processing all the pilots within a user data segment.

16. The system of claim 10, wherein the processing module further includes:
a phase difference calculator for calculating a phase difference between two predetermined pilots within a user data segment; and
an FFT window synch unit for adjusting the positioning of an upstream FFT window if the calculated phase difference exceeds a predetermined value.

17. The system of claim 16, wherein the carrier frequency offset module further includes:
a rate of phase difference estimator coupled to the phase difference calculator for tracking the change of the calculated phase difference over multiple user data segments, the estimator compensating the derived carrier frequency offset for phase rotations due to a drifting FFT window.

18. A system for processing an Orthogonal Frequency Division Multiplexing (OFDM) signal, the system comprising:
means for extracting a first plurality of pilots from a first user data segment of an OFDM signal;
means for calculating an independent phase error for each pilot of the first plurality of pilots and a first common phase error based upon an average of said independent phase errors for each pilot of said first plurality of pilots;
means for extracting a second plurality of pilots from a second user data segment of the OFDM signal, each pilot of said second plurality of pilots associated with one pilot from said first plurality of pilots;
means for separately derotating each pilot of the second plurality of extracted pilots, said derotation based upon the calculated first common phase error and the calculated independent phase error for the associated pilot from said first plurality of pilots;

means for processing the extracted pilots to compensate for an FFT window drift;

means for calculating a phase error for each separately derotated pilot of said second plurality of pilots and a second common phase error based in part upon an average of said phase errors for each separately derotated pilot of said second plurality of extracted pilots; and means for deriving a carrier frequency offset estimate from the second common phase error.

* * * * *